United States Patent
Bois et al.

(10) Patent No.: US 7,378,598 B2
(45) Date of Patent: May 27, 2008

(54) PRINTED CIRCUIT BOARD SUBSTRATE AND METHOD FOR CONSTRUCTING SAME

(75) Inventors: Karl Joseph Bois, Ft. Collins, CO (US); Timothy L. Michalka, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 239 days.

(21) Appl. No.: 10/782,640

(22) Filed: Feb. 19, 2004

(65) Prior Publication Data
US 2005/0183883 A1   Aug. 25, 2005

(51) Int. Cl.
*H01R 12/14* (2006.01)
*H05K 1/11* (2006.01)

(52) U.S. Cl. .................. 174/261; 174/257; 174/258

(58) Field of Classification Search ........ 361/784–795; 174/254–260; 428/209–210
See application file for complete search history.

(56) References Cited

U.S. PATENT DOCUMENTS

| | | | |
|---|---|---|---|
| 4,747,897 A | | 5/1988 | Johnson |
| 5,103,293 A | * | 4/1992 | Bonafino et al. ........... 257/702 |
| 5,371,653 A | * | 12/1994 | Kametani et al. .......... 361/721 |
| 5,839,188 A | * | 11/1998 | Pommer ..................... 29/830 |
| 6,344,371 B2 | * | 2/2002 | Fischer et al. .............. 438/106 |
| 6,353,997 B1 | | 3/2002 | Su |
| 6,387,205 B1 | | 5/2002 | Appelt et al. |
| 6,495,770 B2 | * | 12/2002 | Li et al. ..................... 174/255 |
| 6,998,540 B2 | * | 2/2006 | Belke et al. ................ 174/263 |
| 2002/0125044 A1 | | 9/2002 | Johnson |

OTHER PUBLICATIONS

"Printed Wiring Board Products"; Hitachi Chemical Co. America, Ltd.; 2 pages; undated.
Partangel, Narayanan S.; Master's Thesis; "The Relationship Between Process and Manufacturing Plant Performance: A Goal Programming Data Envelopement Analysis Approach"; Chapter 5; Digital Library and Archives; pp. 47-56; Sep. 17, 1999.
"A Low Loss Dielectric for High Frequency HDI Substrates and PCBs"; Microwave Journal; 2 pages; Dec. 2000.

* cited by examiner

*Primary Examiner*—Tuan T. Dinh

(57) ABSTRACT

A printed circuit board (PCB) substrate and method for construction of the same. In one embodiment, a first dielectric material is associated with a first current return layer and a second dielectric material is associated with a second current return layer. A signal path layer is interposed between the first dielectric material and the second dielectric material. An adhesive layer is interposed between the first dielectric material and the second dielectric material such that the adhesive layer is substantially coplanar relative to the signal path layer.

8 Claims, 4 Drawing Sheets

PRINTED CIRCUIT BOARD SUBSTRATE AND METHOD FOR CONSTRUCTING SAME

BACKGROUND

In recent years, the computer industry has strived to introduce printed circuit board (PCB) substrates having low attenuation at high frequencies, for example at frequencies greater than 1 GHz. Relatedly, the industry has further endeavored to lower attenuation in PCB substrates that may employ odd mode propagation via differentially coupled traces. These attenuation loses are associated with the loss tangent of the PCB substrate composite material, wherein the complex dielectric constant, $\epsilon_r$, of the composite material varies by frequency and may be expressed by the following equation:

$\epsilon_r = \epsilon'_r - j\epsilon''_r$, wherein $\epsilon'_r$ is the relative permittivity of the composite material which varies as a function of frequency; and $\epsilon''_r$ is the loss factor of the composite material which varies as a function of frequency.

Loss tangent, tan $\delta$, may be defined by the following equation in terms of the relative permittivity, $\epsilon'_r$ and the loss factor, $\epsilon''_r$:

$\tan \delta = \epsilon''_r / \epsilon'_r$

Existing PCB substrates include signal traces disposed in a composite dielectric material, such as a Fire Retardant (FR)-4 material, which is an inexpensive composite material formed by glass strands embedded in an epoxy resin. During the curing of the dielectric material, the resin component and the glass component cure at different rates, thereby creating a phase separation defined by a glass phase that is superposed over a resin phase. Generally, the resin phase has a higher loss tangent than the glass phase and in particular instances the resin phase may have a loss tangent as high as 0.4. Hence, the high loss resin settling between the signal traces can cause a significant amount of differential mode signal attenuation. Presently, the differential mode attenuation in PCB substrates is lowered by constructing the entire PCB substrate from materials having low loss tangents. Low loss tangent materials, however, add significant material costs to PCB substrate construction.

SUMMARY

A printed circuit board (PCB) substrate and method for construction of the same are disclosed. In one embodiment, a first dielectric material is associated with a first current return layer and a second dielectric material is associated with a second current return layer. A signal path layer is interposed between the first dielectric material and the second dielectric material. An adhesive layer is interposed between the first dielectric material and the second dielectric material such that the adhesive layer is substantially coplanar relative to the signal path layer.

DETAILED DESCRIPTION OF THE DRAWINGS

Figure 1A:
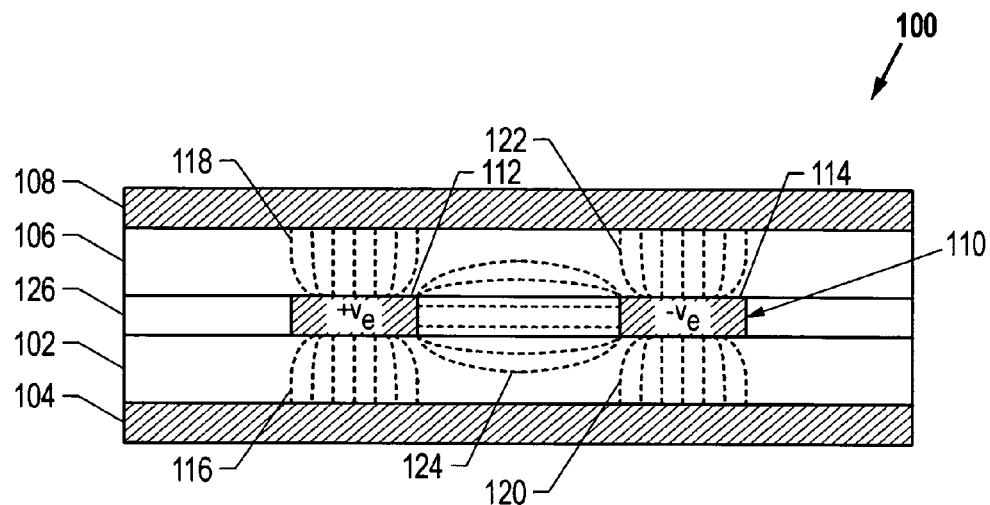
FIG. 1A depicts a cross-sectional view of one embodiment of a printed circuit board (PCB) substrate having a pair of signal traces electrically coupled in a differential mode.

In the drawings, like or similar elements are designated with identical reference numerals throughout the several views thereof, and the various elements depicted are not necessarily drawn to scale. Referring now to FIG. 1, one embodiment of a printed circuit board (PCB) substrate 100 is illustrated. A dielectric material layer 102 designated as a first dielectric material is associated with a current return path layer 104 that is designated as a first current return layer. The dielectric material layer 102 may include the aforementioned FR-4 material, core material, or pre-preg material, which is a semi-cured epoxy. In another embodiment, the dielectric material may include any suitable B-stage material including, for example, resins, laminates, bond-plys, or polymers. The current return layer 104 comprises a conductive medium, such as copper, that may serve as either a power layer or a ground layer. Further, in one implementation, the current return layer 104 may comprise etched-out copper cladding.

Another dielectric material layer 106 designated as a second dielectric material is associated with a current return path layer 108, i.e., a second current return path layer. Similar to the dielectric material layer 102, the dielectric material layer 106 may include an FR-4 material, core material, pre-preg material, or B-stage material. Likewise, the current return layer 108 comprises a conductive medium that may serve as either a power layer or a ground layer. In one implementation, current return layer 104 and current return layer 108 are complementary power and ground planes, e.g., if current return layer 104 is power, then current return layer 108 is ground. In other embodiments, it is possible that current return layers 104 and 108 could both be ground planes or power planes.

A signal path layer 110, which includes signal traces 112 and 114, is interposed between the dielectric material 102 and the dielectric material 106. The signal traces 112 and 114 may comprise any conductive material, such as copper. In one embodiment, plated-through vias may be provided between the signal traces 112 and 114 and the dielectric materials 102 and 106 in order to connect the signal path layer 110 to various other layers. The vias may be filled with a conductive paste or other conductive material. As those skilled in the art will appreciate, flux as represented by flux lines 116 and 118 exists between current return layer 104 and signal trace 112 and current return layer 108 and signal trace 112. Similarly, flux lines 120 and 122 represent flux between signal trace 114 and current return layers 104 and 108, respectively. Further, as illustrated by lines of flux 124, signal trace 112 and signal trace 114 are in a differential mode wherein signal trace 112 is positive, i.e., $+V_e$, and signal trace 114 is negative, i.e., $-V_e$, with respect to each other.

An adhesive layer 126 is interposed between the dielectric material 102 and the dielectric material 106. Additionally, as illustrated, the adhesive layer 126 is disposed substantially coplanar relative to the signal path layer 110. The adhesive layer 126 is comprised of a material operable to substantially reduce the attenuation due to electrical coupling as represented by lines of flux 124 between signal traces 112 and 114. The adhesive layer 126 comprises a low loss material relative to the dielectric materials 102 and 106. In particular, the adhesive layer 126 comprises a material having a lower loss tangent than the dielectric materials 102 and 106. For example, in one embodiment, the loss tangent of the adhesive layer may be 0.001. By placing the adhesive layer 126 having a low loss tangent between the signal traces 112 and 114, i.e., proximate to the region of greatest attenuation, any differential mode attenuation that may exist between the signal traces 112 and 114 can be substantially lowered. Accordingly, the provisioning of adhesive layer 126 in the PCB substrate 100 supports longer distance and higher frequency signal transmission without the need to resort to assembling entire PCB substrates of expensive low loss materials. Whereas the propagation delay of the adhesive layer 126 may sometimes be similar to the propagation delay of the dielectric materials 102 and 106, the material of the adhesive layer 126 is usually provided with a higher glass transition temperature ($T_g$) than that of the dielectric materials 102 and 106. In instances where the adhesive layer 126 is a composite material, the adhesive layer 126 with the higher glass transition temperature is able to resist separating into multiple phases, which is a problem in existing PCB substrates where the instant adhesive layer is not employed.

In one embodiment, the adhesive layer 126 may comprise a two-sided tape or an adhesive film having a copper foil. In addition to possessing low loss properties, adhesive film having a copper foil provides excellent reliability, adhesion and heat resistance properties that translate into a high $T_g$. Adhesive film also has a processability similar to that of FR-4 and may be easily laser etched to form interstitial via holes (IVHs). Hitachi Chemical Co. America, Ltd. of Cupertino, Calif., provides suitable adhesive films having a copper foil under the designations Type No. MCF-6000E, Type No. MCF-1000E, Type No. MCF-4000G, and Type No. MCF-7000LX.

Alternatively, the adhesive layer 126 may be an epoxy adhesive sheet comprising a glass-based adhesive that provides a low loss tangent, thin form factor, flat surface, and high $T_g$. By way of example, aforementioned Hitachi Chemical Co. manufactures and distributes an epoxy adhesive sheet under the designation Type No. GEA-679P. In a further implementation, the adhesive layer 126 may comprise an expanded polytetrafluoroethylene (ePTFE) that has been impregnated with a resin by replacing the air space inside the ePTFE with the resin such that the ePTFE membrane becomes the carrier or delivery system for the resin. Several distinct performance benefits are derived from the use of impregnated ePTFE. In particular, the impregnated ePTFE provides-a low dielectric constant that reduces signal delay and offers designers increased electrical line lengths for PCB substrate design. The material's low loss tangent, which may be 0.0036 over a range of 1 MHz to 10 GHz, provides significant reductions in signal attenuation and the lower dielectric constant permits wider line widths for a given transmission impedance, thus maximizing trace cross-sectional area and reducing skin effect. W.L. Gore & Associates Inc. of Elkton, Md., manufactures and distributes an impregnated ePTFE under the brand name Speedboard C™.

In recent years, the computer industry has strived to introduce system links that operate in the gigahertz regime. Due to the increase in data bandwidth and decrease in voltage margin, the attenuation and distortion caused by the channel is of much more concern today than in past system generations. Accordingly, the PCB substrate scheme described herein advantageously complements the current data bandwidth and voltage margin requirements by minimizing the attenuation and distortion present in differential mode coupling. In particular, by employing the adhesive layer embodiments described herein, high-speed system links can be supported in PCB substrates with minimal impact on their manufacturability or cost structure.

Figure 1B:
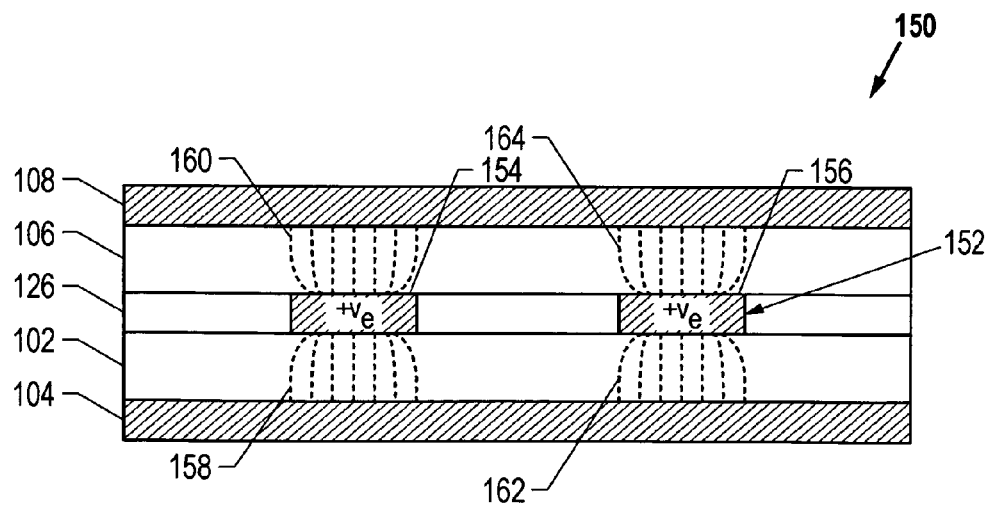
FIG. 1B depicts a cross-sectional view of another PCB substrate similar to that of FIG. 1 wherein the pair of signal traces are shown to be electrically coupled in a common mode.

FIG. 1B depicts a PCB substrate 150 wherein, similar to PCB substrate 100 of FIG. 1A, dielectric material 102 is associated with current return layer 104 and dielectric material 106 is associated with current return layer 108. Adhesive layer 126 is interposed between the dielectric materials 102 and 106. A signal path layer 152, which includes signal trace 154 and signal trace 156, is coplanar with the adhesive layer 126. The signal traces 154 and 156 are operable in a common mode, which may be referred to as "even" mode coupling, as represented by the $+V_e$ indicia associated with the signal traces 154 and 156. It should be appreciated, however, that common mode coupling may also arise when the signal traces 154 and 156 are negative, i.e., $-V_e$. It should further be appreciated that a particular PCB substrate of the design described herein is compatible with both differential mode signaling and common mode signaling that may be utilized in the electric component in which the instant PCB substrate is integrated.

With respect to signal trace 154, lines of flux 158 and 160 are present between current return layer 104 and current return layer 106, respectively. Similarly, with respect to signal trace 156, lines of flux 162 and 164 are present between current return layer 104 and current return layer 106, respectively. As opposed to signal traces 112 and 114 of FIG. 1A, since the signal traces 154 and 156 are coupled in a common mode, no lines of flux exist therebetween. Hence, the adhesive layer 126 minimally impacts propagation in the common mode. In other words, the adhesive layer 126 positively impacts signal attenuation (i.e., by lowering signal loss) in signaling paths where differential mode coupling is effectuated while not negatively impacting signal propagation in common mode signaling paths.

Figure 2A:
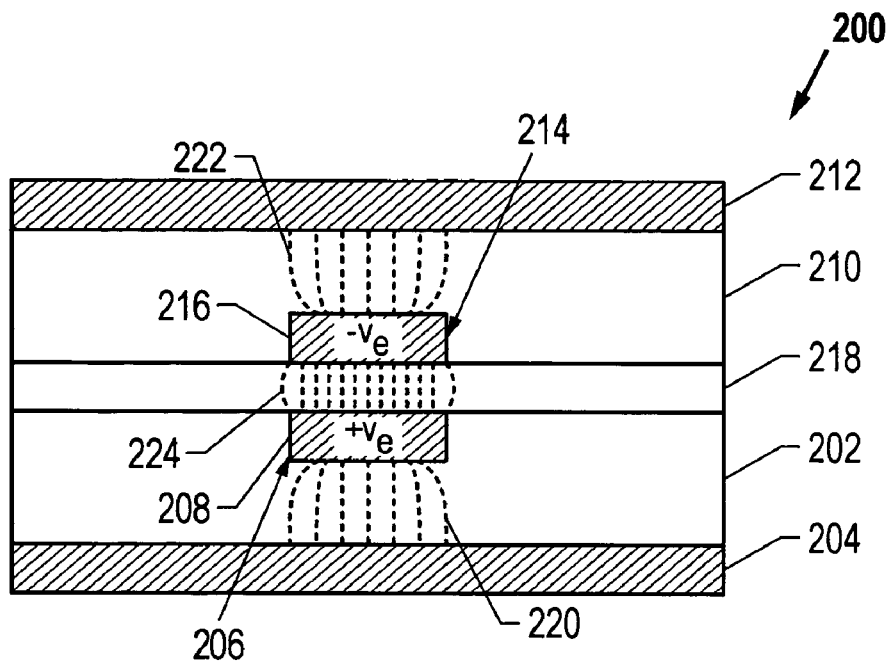
FIG. 2A depicts a cross-sectional view of an embodiment of a PCB substrate having a pair of signal traces disposed in a stack-up arrangement and electrically coupled in a differential mode.

FIG. 2A depicts an embodiment of a PCB substrate 200 where signal traces are disposed in a stack-up arrangement. Similar to the PCB embodiments discussed above, a dielectric material layer 202, i.e., a first dielectric material, is associated with a current return path layer 204, i.e., a first current return layer. A signal path layer 206, i.e., a first signal path layer, is embedded in the dielectric material 202 and, as illustrated, includes a positive signal trace 208, which is marked $+V_e$. Another dielectric material layer 210, i.e., a second dielectric material, is associated with a current return path layer 212, i.e., a second current return layer. A signal path layer 214, i.e., a second signal path layer, is embedded in the dielectric material 210 such that the signal path layer 214 is substantially parallel to the signal path layer 206 in a stack-up arrangement, which may be referred to as a broadside coupling arrangement. As illustrated, signal path layer 214 includes a negative signal trace 216, which is marked negative ($-V_e$) Hence, the signal traces 208 and 216 are coupled together in a differential mode. An adhesive layer 218 is interposed between the dielectric material 202 and the dielectric material 210. Due to the electrical fields generated, lines of flux 220, 222, and 224 are disposed between the various pairs of conductive elements, i.e., between current return layer 204 and signal trace 208, between current return layer 212 and signal trace 216, and between the two signal traces 208 and 216, of the PCB substrate 200. It will be recognized that the dielectric materials 202 and 210, the current return layers 204 and 212, the adhesive layer 218, and the signal path layers 206 and 214 have a similar construction to their respective counterparts in FIG. 1A and FIG. 1B.

In particular, similar to the adhesive layer 126 discussed above the adhesive layer 218 is constructed of a material having a low loss tangent in order to provide significant reduction in differential mode signal attenuation and permit wider line widths for a given transmission impedance. In one implementation, the loss tangent of the adhesive layer 218 is lower than the loss tangent of the dielectric materials 202 and 210. By utilizing an adhesive layer 218 having a low loss tangent in the region of greatest attenuation, i.e., between the signal traces 208 and 216, the attenuation in the PCB substrate 200 is advantageously reduced.

Figure 2B:
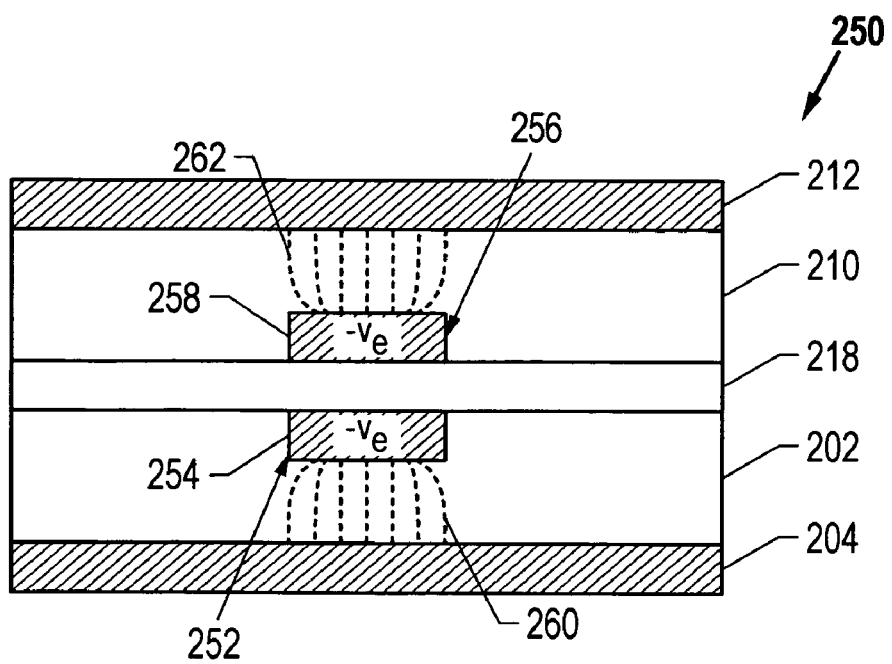
FIG. 2B depicts a cross-sectional view of another PCB substrate similar to that of FIG. 2A wherein the pair of signal traces are shown to be electrically coupled in a common mode.

FIG. 2B depicts a PCB substrate 250 that is similar to the PCB substrate 200 of FIG. 2A. Specifically, in the illustrated embodiment, dielectric material 202 is associated with current return layer 204 and dielectric material 210 is associated with current return layer 212. As before, adhesive layer 218 is interposed between the dielectric material 202 and the dielectric material 210. On the other hand, signal path layers 252 and 256 disposed in a stack-up arrangement are electrically coupled in a common mode as represented by the $-V_e$ indications on the respective signal traces 254 and 258. Because of the common mode coupling between signal traces 254 and 258, no flux lines are shown therebetween. Rather, lines of flux 260 and 262 are respectively present between current return layer 204 and signal trace 254 and between current return layer 212 and signal trace 256. As previously discussed, the instant PCB substrate scheme does not negatively affect common mode signal propagation and the same property is maintained even in stack-up trace arrangements such as the PCB substrate 250 shown in FIG. 2B.

Figure 3:
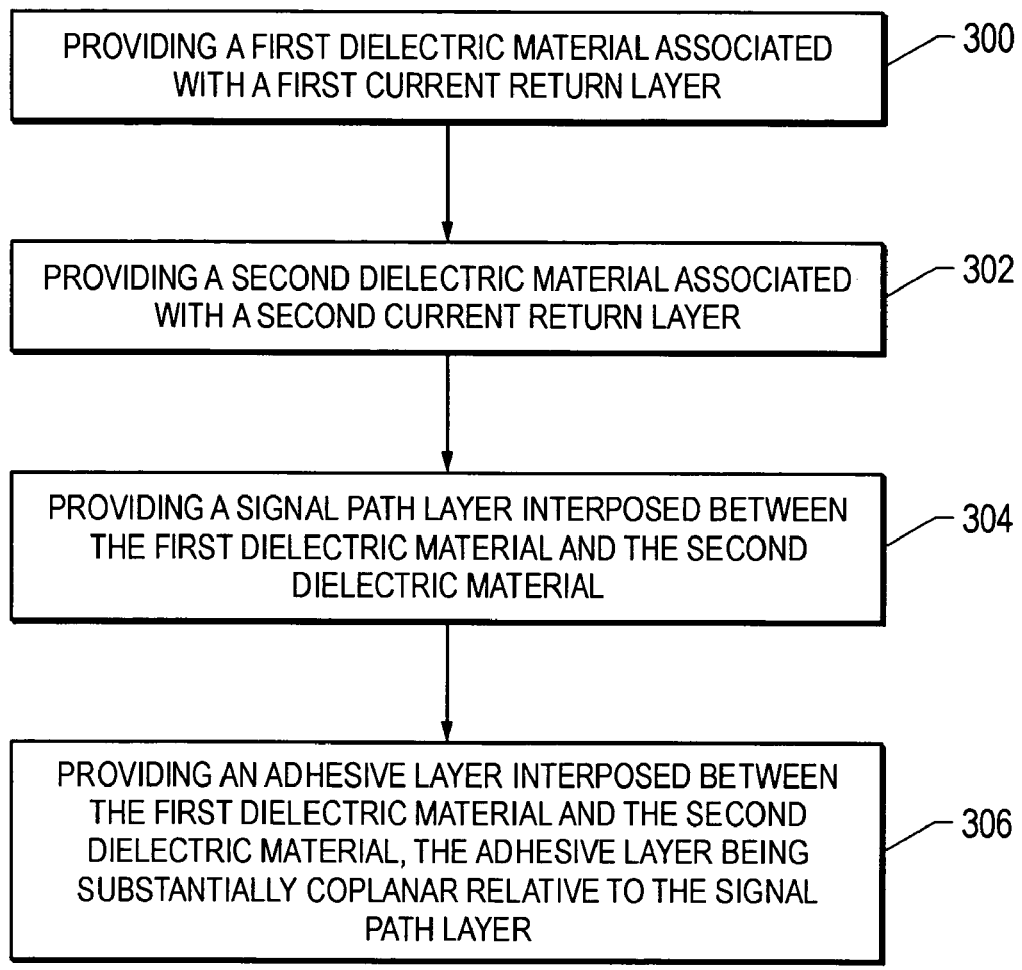
FIG. 3 depicts a flow chart of one embodiment of a method for constructing a PCB substrate.

FIG. 3 depicts one embodiment of a method for constructing a PCB substrate. At block 300, a first dielectric material is provided that is associated with a first current return layer. At block 302, a second dielectric material is provided that is associated with a second current return layer. At block 304, a signal path layer is provided that is interposed between the first dielectric material and the second dielectric material. At block 306, an adhesive layer is provided interposed between the first dielectric material and the second dielectric material. In particular, the adhesive layer is substantially coplanar relative to the signal path layer and comprises a material operable to substantially reduce the attenuation due to an electrical coupling effect between the first signal trace disposed in the first signal path layer and the second signal trace disposed in the second signal path layer. Further, it should be appreciated that the PCB substrate layers described herein are contemplated to be amenable to various manufacturing processes associated with PCBs. As previously alluded, the dielectric materials and adhesive layer may be cured. Moreover, the PCB substrate described herein may be further processed, by pressure and heat under a vacuum, for example, in the construction of a multilayer PCB panel wherein the PCB substrate described herein forms one or more of the laminated layers.

Figure 4:
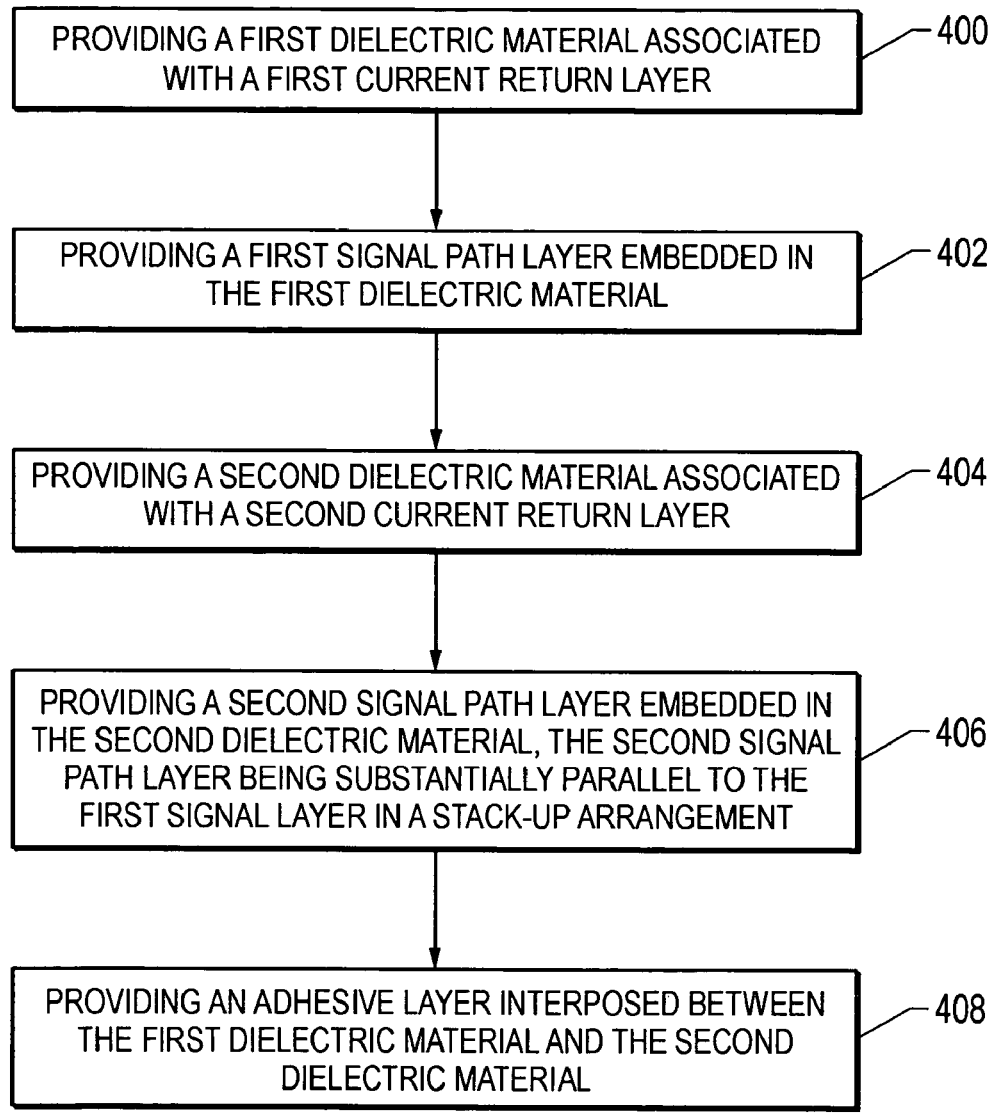
FIG. 4 depicts a flow chart of a further embodiment of a method for constructing a PCB substrate.

FIG. 4 depicts a flow chart of a further embodiment of a method for constructing a PCB substrate. At block 400, a first dielectric material is provided that is associated with a first current return layer. At block 402, a first signal path layer is provided that is embedded in the first dielectric material. At block 404, a second dielectric material is provided that is associated with a second current return layer. At block 406, a second signal path layer is provided that is embedded in the second dielectric material. The second signal path layer is substantially parallel to the first signal layer in a stack-up arrangement. At block 408, an adhesive layer is interposed between the first dielectric material and the second dielectric material. The adhesive layer includes a material operable to substantially reduce attenuation due to an electrical coupling effect between a first signal trace disposed in the first signal path layer and a second signal trace disposed in the second signal path layer.

Although the invention has been particularly described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A printed circuit board (PCB) substrate, comprising:
   a first dielectric material associated with a first current return layer;
   a second dielectric material associated with a second current return layer;
   a signal path layer interposed between said first dielectric material and said second dielectric material; and
   an adhesive layer interposed between said first dielectric material and said second dielectric material, said adhesive layer being substantially coplanar relative to said signal path layer and comprising an adhesive film having a copper foil,
   wherein said adhesive layer has a lower loss tangent than at least one of said first and second dielectric materials, said adhesive layer comprising a material operable to substantially reduce attenuation due to an electrical flux coupling effect between a pair of signal traces disposed in said signal path layer.

2. The PCB substrate as recited in claim 1, wherein said adhesive layer has a higher glass transition point ($T_g$) than said first dielectric material.

3. The PCB substrate as recited in claim 1, wherein said first dielectric material comprises a material selected from the group consisting of FR-4 material, pre-preg material, core material, and B-stage substrate material.

4. The PCB substrate as recited in claim 1, wherein said adhesive layer has a loss tangent of about 0.0036 or less.

5. A method for constructing a printed circuit board (PCB) substrate, comprising:
   providing a first dielectric material associated with a first current return layer;
   providing a second dielectric material associated with a second current return layer;
   providing a signal path layer interposed between said first dielectric material and said second dielectric material;
   selecting an adhesive layer having a lower loss tangent than at least one of said first and second dielectric materials, said adhesive layer comprising an adhesive film having a cooper foil; and
   providing said adhesive layer interposed between said first dielectric material and said second dielectric material, said adhesive layer being substantially coplanar relative to said signal path layer, wherein said adhesive layer operates to substantially reduce attenuation due to an electrical flux coupling effect between a pair of signal traces disposed in said signal path layer.

6. The method as recited in claim 5, further comprising selecting said adhesive layer to include a material having a higher glass transition point ($T_g$) than said first dielectric material.

7. The method as recited in claim 5, further comprising curing a layer of said PCB substrate, said layer selected from the group consisting of said first dielectric material, said second dielectric material, and said adhesive layer.

8. The method as recited in claim 5, wherein said adhesive layer selected has a loss tangent of about 0.0036 or less.

* * * * *

UNITED STATES PATENT AND TRADEMARK OFFICE
CERTIFICATE OF CORRECTION

| | | |
|---|---|---|
| PATENT NO. | : 7,378,598 B2 | Page 1 of 1 |
| APPLICATION NO. | : 10/782640 | |
| DATED | : May 27, 2008 | |
| INVENTOR(S) | : Karl Joseph Bois et al. | |

It is certified that error appears in the above-identified patent and that said Letters Patent is hereby corrected as shown below:

In column 6, line 64, in Claim 5, delete "cooper" and insert -- copper --, therefor.

Signed and Sealed this

Fifth Day of August, 2008

JON W. DUDAS
*Director of the United States Patent and Trademark Office*